(12) United States Patent
Yamamoto

(10) Patent No.: US 7,163,137 B2
(45) Date of Patent: Jan. 16, 2007

(54) METHOD OF MANUFACTURING MOUNTING BOARDS

(75) Inventor: Yuusuke Yamamoto, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/863,398

(22) Filed: Jun. 8, 2004

(65) Prior Publication Data

US 2005/0161492 A1    Jul. 28, 2005

(30) Foreign Application Priority Data

Jun. 9, 2003  (JP) .............................. 2003-163624
Nov. 27, 2003 (JP) .............................. 2003-396908

(51) Int. Cl.
*B23K 31/02* (2006.01)

(52) U.S. Cl. ...................................... 228/103; 228/223

(58) Field of Classification Search ................ 228/103, 228/248.1, 223
See application file for complete search history.

(56) References Cited

U.S. PATENT DOCUMENTS 5,531,021 A * 7/1996 Kolman et al. ............... 29/843
5,745,986 A * 5/1998 Variot et al. .................. 29/840
6,254,923 B1 * 7/2001 Boyd et al. ............ 228/180.22
6,339,254 B1 * 1/2002 Venkateshwaran et al. . 257/686
6,558,978 B1 * 5/2003 McCormick ................ 438/108
6,923,875 B1 * 8/2005 Ikeda et al. ................... 148/24

FOREIGN PATENT DOCUMENTS

JP          2002-217359          8/2002

* cited by examiner

*Primary Examiner*—Jonathan Johnson
(74) *Attorney, Agent, or Firm*—Pearne & Gordon LLP

(57) ABSTRACT

The object is the capability of providing a method of manufacturing mounting boards that enables extensive adoption of a stacked structure at a low cost. As a solution, in the method of manufacturing a mounting board in which a mounting board is manufactured by mounting a first electronic part 11 and a second electronic part 12 each having a solder bump in its bottom plane on a substrate 3 in stacked plural levels, after the first electronic part 11 is mounted on the substrate 3 that has been fed with solder, the solder bump 18 of the second electronic part 12 is mounted on the electrode 17 provided on the upper plane of the first electronic part 11, and thereafter the substrate 3 is heated in a reflow step to solder-bond the first electronic part 11 to substrate 3 along with solder-bonding the second electronic part 12 to the first electronic part 11. By such process, a stacked structure can be applied to a wide variety of electronic parts at a low cost.

4 Claims, 6 Drawing Sheets

METHOD OF MANUFACTURING MOUNTING BOARDS

BACKGROUND OF THE INVENTION

1. Field of the Invention

The present invention relates to a method of manufacturing mounting boards comprising mounting electronic parts in stacked multiple levels on a substrate.

2. Description of the Related Art

In recent years, electronic devices such as cell phones and video cameras are rapidly becoming smaller and more sophisticated. In such a trend, the mounting board constituting the electronic circuits of those electronic devices are requested to have still higher packaging densities. To meet the requirement of packaging density enhancement for mounting boards, semiconductor packages having electronic parts stacked in the vertical direction are being used (Refer to, for example, Japanese Patent Laid-open No. 2002-217359).

With the adoption of semiconductor packages of such a stacked structure, manufacture of function-enhanced mounting boards is possible without increasing the board size.

However, the semiconductor package set forth in the preceding techniques cited above is manufactured by combining plural electronic parts whereby complicated steps are needed including the inspection of operation as a stacked structure during the development of such semiconductor elements. Accordingly, a considerably long period has been needed for the development of a semiconductor device as an individual electronic part. Due to such background, the types of the electronic parts to be used in a semiconductor package of stacked structure have been rather limited, and thus it was difficult to adopt the stacked structure in various applications at a low cost.

SUMMARY OF THE INVENTION

Under such a situation, the invention can provide a method of manufacturing mounting boards with which a stacked structure can be extensively applied at a low cost.

The method of manufacturing a mounting board in accordance with the invention comprises mounting on a substrate electronic parts having a solder bump provided on the bottom surface thereof in stacked multiple levels, and includes a solder-feeding step in which solder is fed onto an electrode of said substrate, a first recognition step in which the position of said substrate is recognized, a first mounting step in which an electronic part for a first level is positioned relative to said solder-supplied substrate according to the recognition result in said first recognition step followed by landing said solder bump on said electrode in register, a second recognition step in which the position of said electronic part for the first level is recognized, a second mounting step in which an electronic part for a second level is positioned relative to said electronic part for the first level according to the recognition result in said second recognition step followed by landing said solder bump of the electronic part for the second level on a connecting electrode provided on the upper surface of the electronic part for the first level in register, and a reflow step in which the substrate on which the electronic part for the first level and the second electronic part are mounted is heated so as to solder-bond the electronic part for the first level to said substrate and at the same time solder-bond the electronic part for the second level to the electronic part for the first level.

According to the invention, after an electronic part for a first level is mounted on a substrate which has been fed with solder, an electronic part for a second level is mounted on the electronic part for the first level. And then by heating the substrate now carrying the electronic part for the first level and the one for the second level, mounting of these parts constituting a stacked structure completes in a single mounting step, since, along with the solder-bonding of the electronic part for the first level to the substrate, the electronic part for the second level is solder-bonded to the one for the first level. Therefore, a stacked structure can be extensively adopted for various applications at a low cost.

BRIEF DESCRIPTION OF THE PREFERRED EMBODIMENTS

Figure 1:
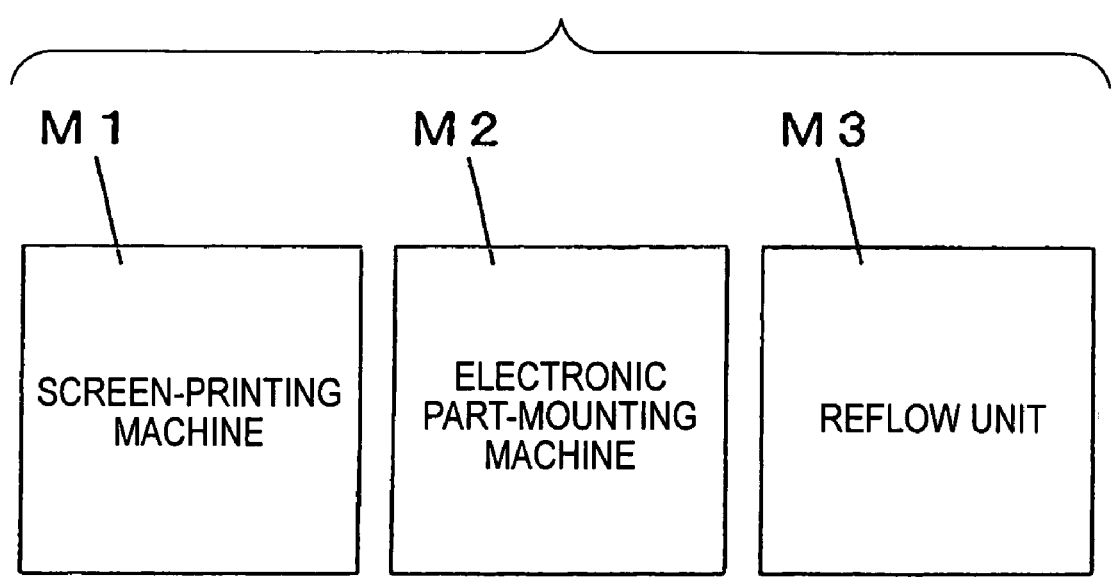
FIG. 1 shows a configuration of a manufacturing line for mounting boards as an embodiment of the invention.
Figure 2:
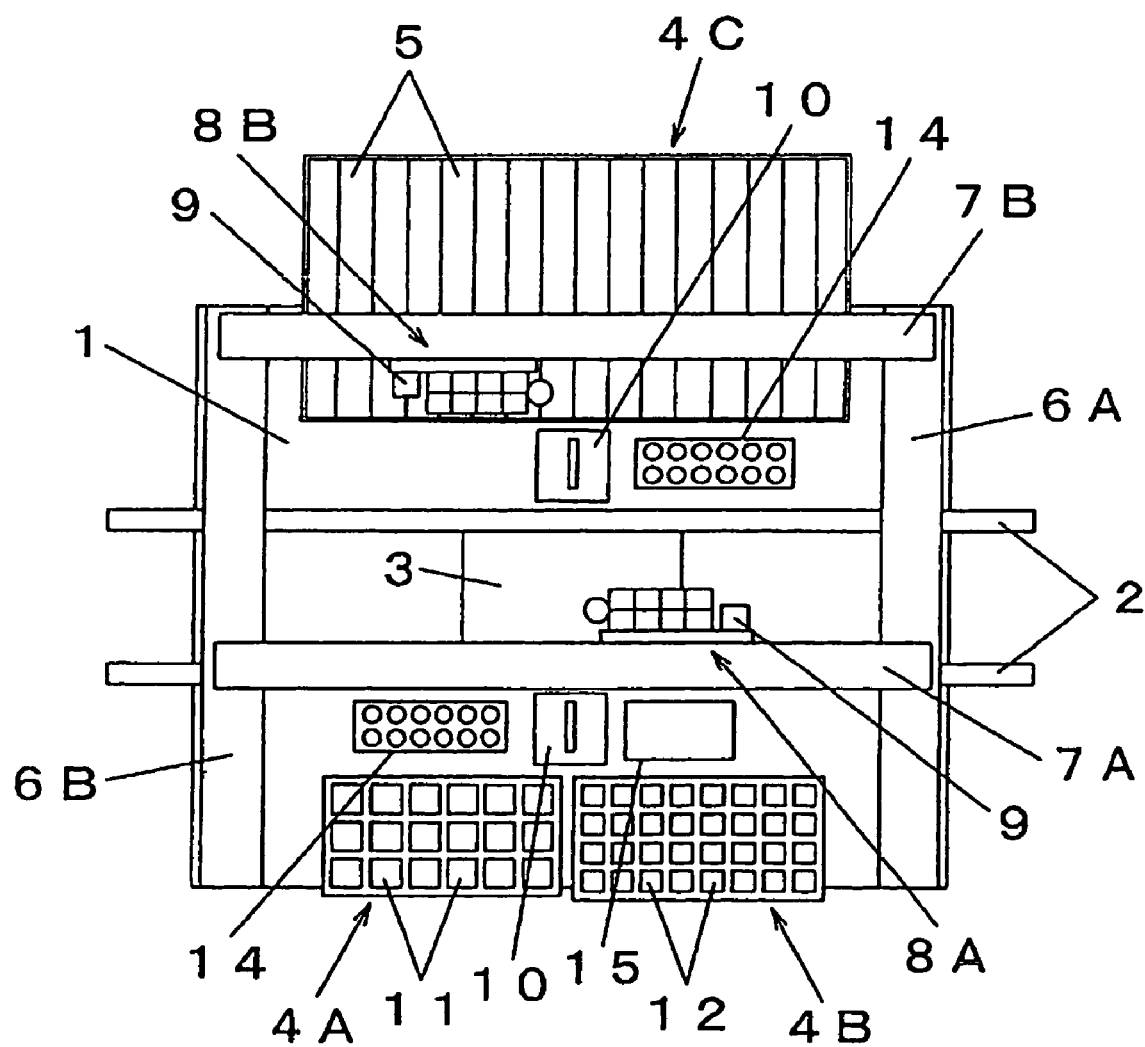
FIG. 2 shows a plan view of an apparatus for mounting electronic parts as an embodiment of the invention.
Figure 3:
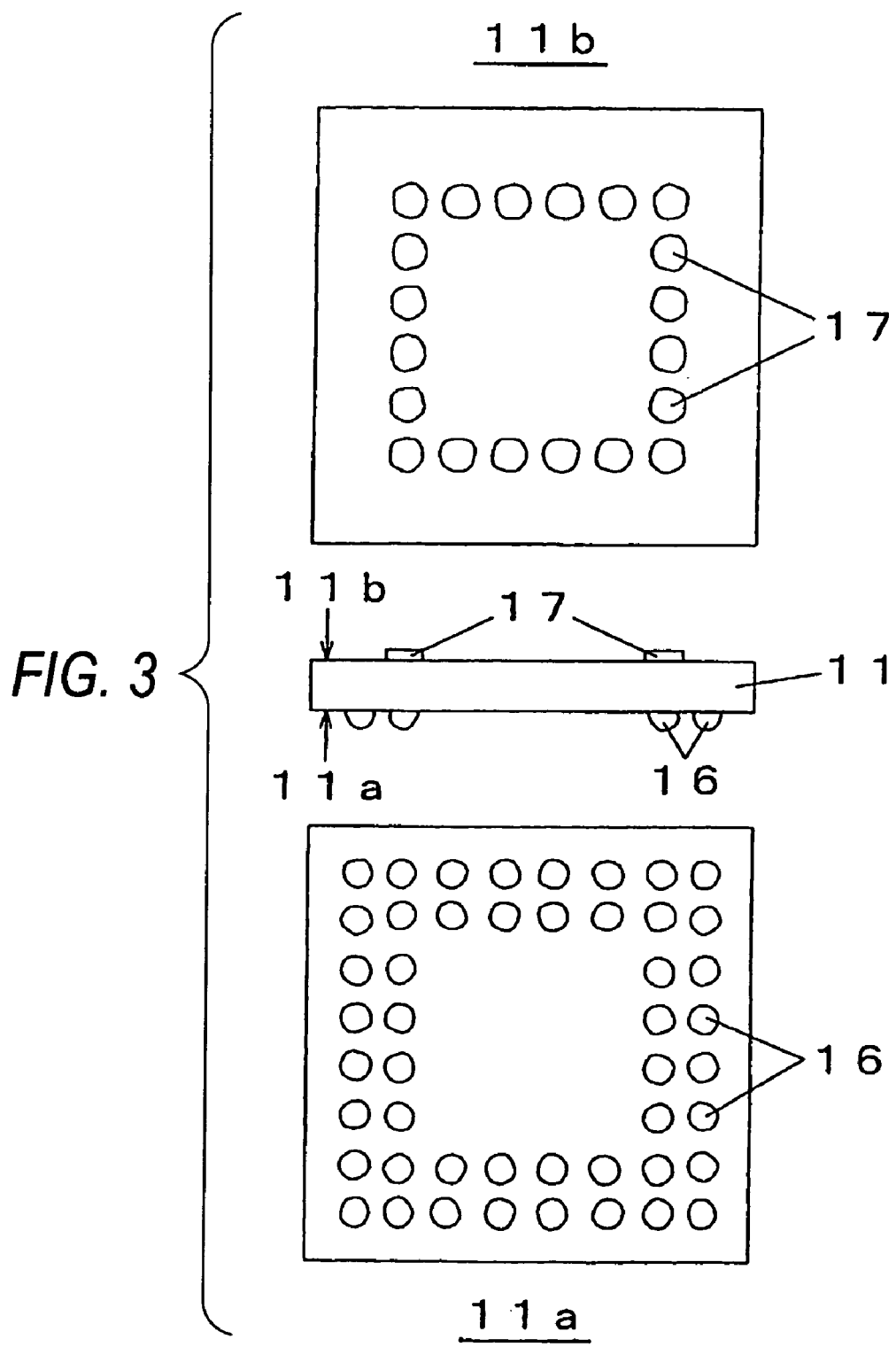
FIG. 3 is a diagram describing the structure of an electronic part to be mounted on a mounting board which constitutes one embodiment of the invention.
Figure 4:
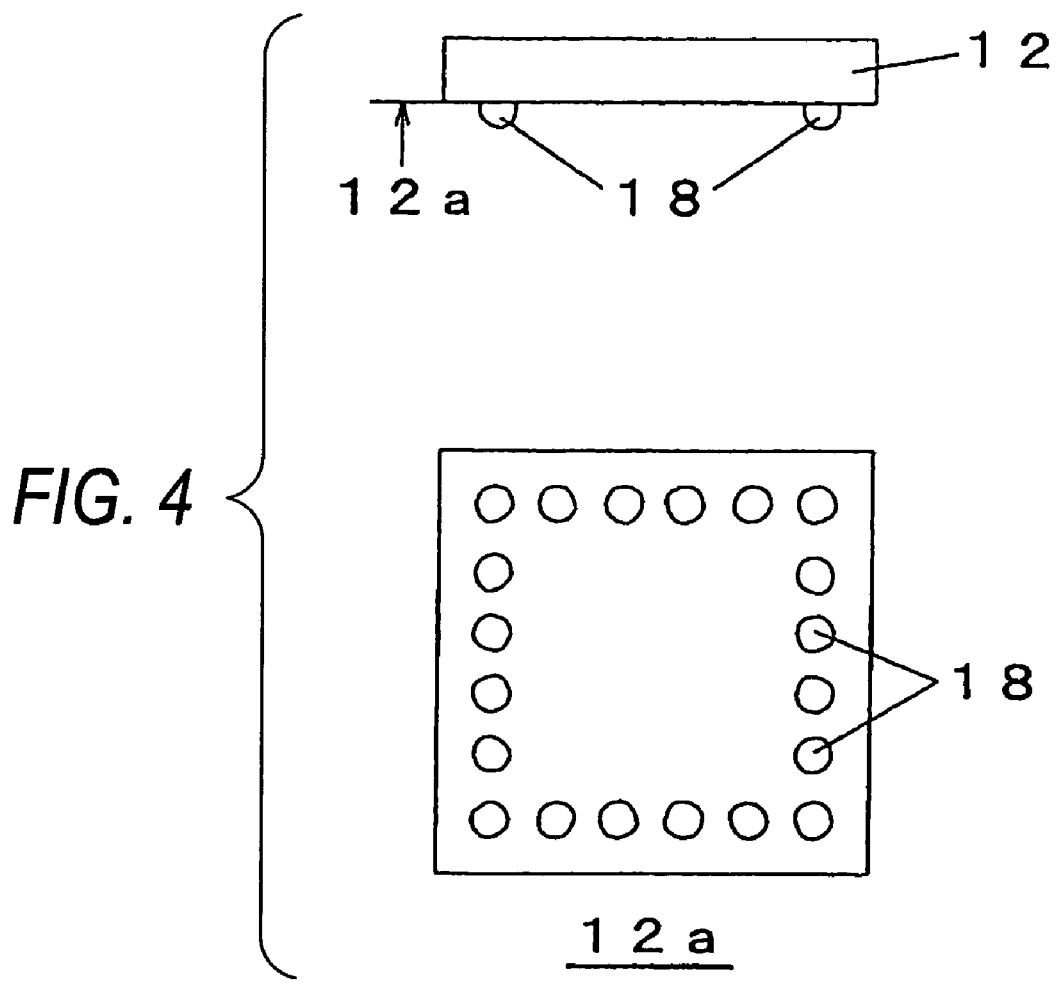
FIG. 4 is a diagram describing the structure of an electronic part to be mounted on a mounting board which constitutes one embodiment of the invention.
Figure 5:
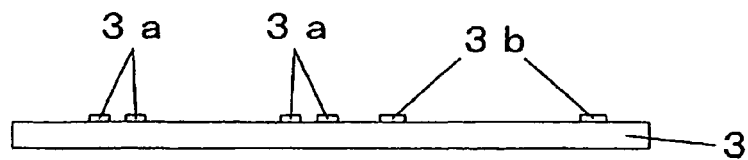
FIG. 5 is a diagram explaining the method of manufacturing a mounting board which constitutes one embodiment of the invention.
Figure 5:
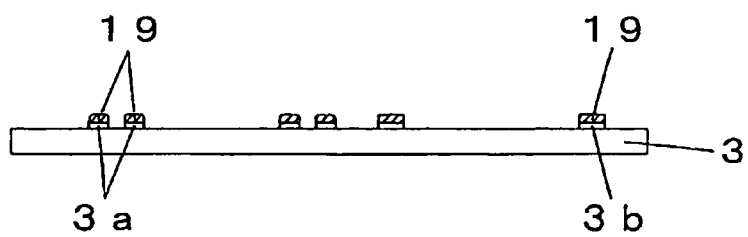
Figure 5:
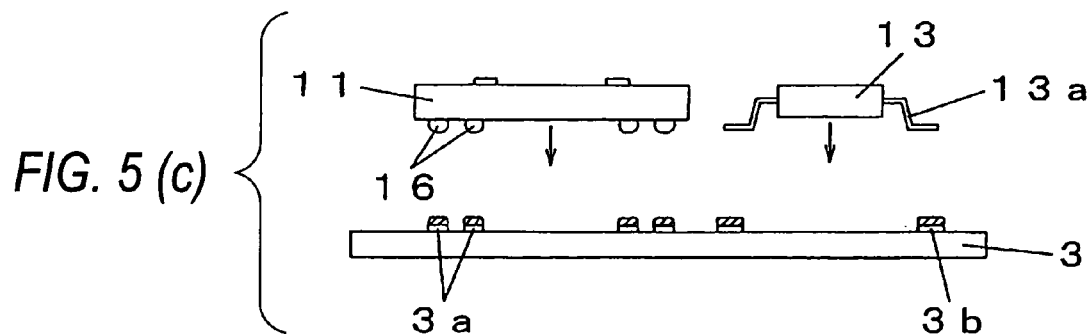
Figure 5:
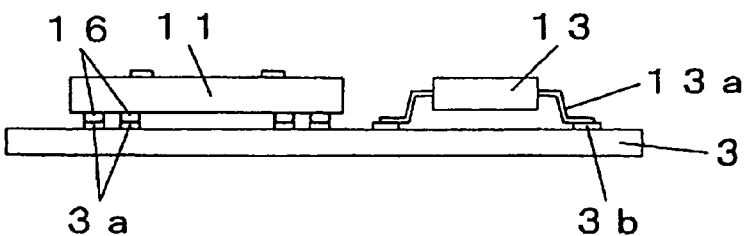
Figure 6:
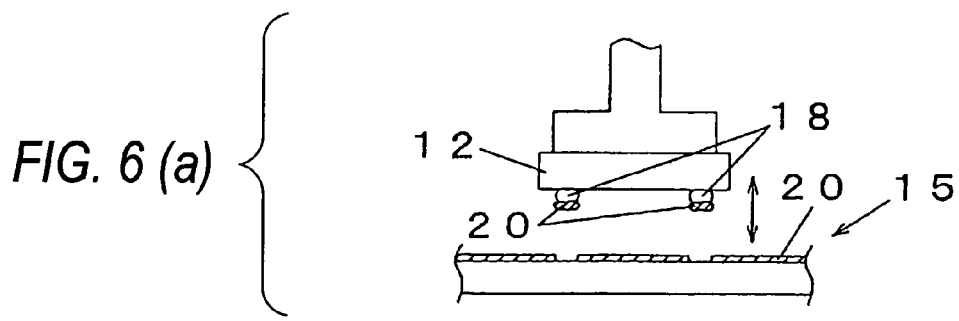
FIG. 6 is a diagram for explaining the method of manufacturing a mounting board which constitutes one embodiment of the invention.
Figure 6:
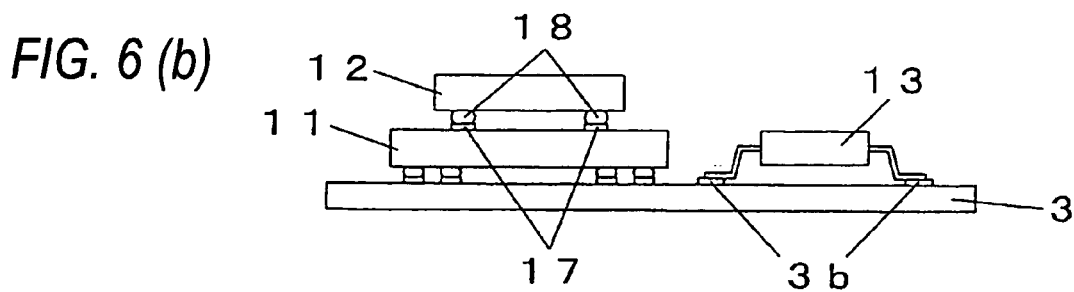
Figure 6:
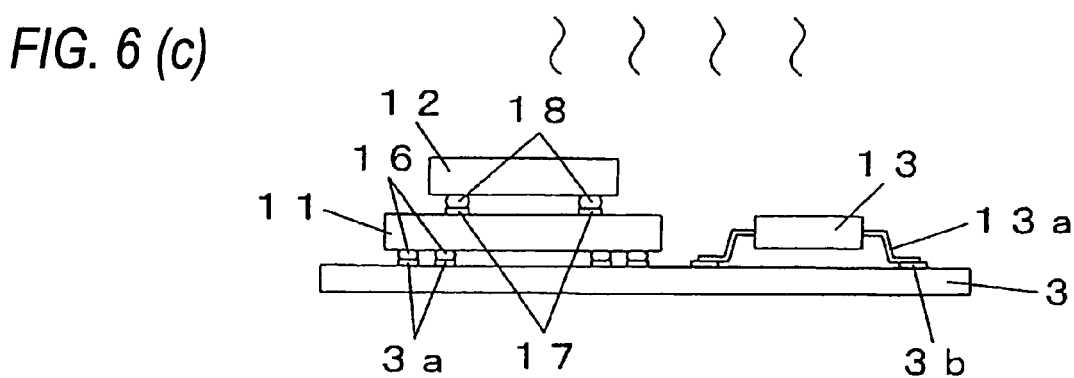

Next, some embodiments for carrying out the invention are described with reference to drawings. FIG. 1 shows a configuration of a manufacturing line for mounting boards as an embodiment of the invention. FIG. 2 shows a plan view of an apparatus for mounting electronic parts as another embodiment of the invention. FIGS. 3 and 4 are diagrams describing the structures of the electronic parts to be mounted on a mounting board which constitutes one embodiment of the invention. And, FIGS. 5 and 6 are diagrams explaining the steps of manufacturing a mounting board which constitutes one embodiment of the invention.

First of all, with reference to FIG. 1, a manufacturing line for mounting boards is described. In FIG. 1, the manufacturing line for mounting boards is configured of a screen-printing machine M1, an electronic part-mounting machine M2, and a reflow unit M3, all of which are connected in series. The screen-printing machine M1 prints on a substrate cream solder used for bonding an electronic part to a substrate. The electronic part-mounting machine M2 mounts an electronic part on the substrate on which the cream solder has been printed. The reflow unit M3 solder-bonds the electronic part to the substrate by heating the substrate carrying the electronic part whereby the solder component in the cream solder is melted to solder-bond the electronic part to the substrate.

Next, with reference to FIG. 2, the structure of the electronic part-mounting machine M2 is described. In FIG. 2, in the central portion of abase 1, a transport path 2 is arranged in the X-direction. The transport path 2 transports a substrate 3 on which an electronic part is to be mounted, and positions the substrate 3 at a place where the electronic part is mounted. In the front side of the transport path 2, a first part-supplying unit 4A and a second part-supplying unit 4B are arranged parallel in the X-direction. In each of the part trays provided in the first part-supplying unit 4A and the second part-supplying unit 4B, first electronic parts 11 or second electronic parts 12 are stored, respectively. In the rear side of the transport path 2, there is arranged a third part-supplying unit 4C, and a tape feeder 5 arranged in the third part-supplying unit 4C supplies a tape carrying a third electronic part 13 (Refer to FIG. 5.) to the pick-up position of a transfer head to be described below by pitch advancement.

At both ends of the base 1 in the X-direction, two Y-axis tables 6A and 6B are arranged, on which X-axis tables 7A and 7B are constructed. On each of the X-axis table 7A and 7B, a transfer head 8A or 8B is installed. Each of the transfer heads 8A and 8B is of a multiple type provided with plural unit transfer heads, and moves together with a substrate recognition camera 9 in a unified manner.

The transfer head 8A moves in the X- and Y-directions by driving the X-axis table 7A and the Y-axis table 6A, whereby the head takes up the first electronic part 11 from the first part-supplying unit 4A, and the second electronic part 12 from the second part-supplying unit 4B by means of an adhesion nozzle of each unit transfer head, and mounts the parts on the substrate 3 which has been positioned along the transport path 2. Further, the transfer head BB moves in the X- and Y-directions by driving the X-axis table 7B and the Y-axis table 6B in a similar manner, whereby the head takes up the third electronic part 13 from the third part-supplying unit 4C by means of an adhesion nozzle of each unit transfer head, and mounts the part on the substrate 3 which has been positioned along the transport path 2.

Between the transport path 2 and the first and second part-supplying units 4A and 4B, a line camera 10, a nozzle stocker 14 and a flux transfer table 15 are arranged, while between the transport path 2 and the third part-supplying unit 4C, a line camera 10 and a nozzle stocker 14 are arranged. Somewhere along the head-moving locus to the substrate 2 after the transfer head 8A or 8B has picked up an electronic part from the corresponding part-supplying unit, the transfer head 8A or 8B passes above the line camera 10 whereby the camera perceives the electronic part held by the transfer head 8A or 8B.

The nozzle stocker 14, which stores a plurality of adsorbing nozzle corresponding to the kind of the electronic part to be mounted on the substrate 3, is designed so that the head can select and equip itself with an adsorbing nozzle corresponding to the electronic part to be mounted by the access of the transfer head 8A or 8B to the nozzle stocker 14. The flux transfer table 15 feeds flux used for solder-bonding in the form of a thin film on the table. By elevating or lowering the transfer head holding an electronic part relative to the flux transfer table 15, the flux is fed by transfer onto the solder bumps provided in the bottom plane of the electronic part.

Now, with reference to FIGS. 3 and 4, the first electronic part 11 and the second one 12 are described. The first electronic part 11, which is a package part fabricated by sealing a semiconductor element with a resin, has, on its bottom plane 11a, a solder bump 16 used for the connection with the substrate 3, and, on its upper plane 11b, an electrode 17 used for the connection with an electronic part to be mounted on the first electronic part 11 in a stacked structure as shown in FIG. 3. The second electronic part 12, which is similarly a package part fabricated by sealing a semiconductor element with a resin, has, on its bottom plane 12a, a solder bump 18 used for the connection with the first electronic part 11 in the same arrangement as the electrode 17 of the first electronic part 11 as shown in FIG. 4.

Next, the method of manufacturing a mounting board which manufactures a mounting board by mounting an electronic part on a substrate 3 is explained. In the present explanation, a mounting board is manufactured by mounting a first electronic part 11 provided with solder bumps on its bottom plane and a second electronic part 12 on the substrate 3 in multiple levels to form a stacked structure.

In FIG. 5(a), on the upper plane of the substrate 3, electrodes 3a and 3b are provided. The electrode 3a has the same arrangement as that of the bump 16 of the first electronic part 11, while the electrode 3b has the same arrangement as that of the lead 13a of the third electronic part 13. The substrate 3 is firstly transported to the screen-printing machine M1 shown in FIG. 1. The screen-printing machine feeds cream solder 19 on the electrodes 3a and 3b on the substrate 3 by means of screen printing (solder-feeding step) as shown in FIG. 5(b). Thereafter, the substrate 3 that has been fed with solder is transported to the electronic part-mounting machine M2, and positioned at the mounting position along the transport path 2. Then, the transfer head 8A (or 8B) is moved above the substrate 3 whereby the substrate recognition camera 9 captures the image of the substrate 3 to discern the position of the substrate 3 (first recognition step). 4

Then, by means of the transfer heads 8A and 8B, electronic parts are mounted on the substrate 3 that has been fed with solder as shown in FIG. 5(c). Firstly, the first electronic part 11 (electronic parts for the first level) is positioned relative to the electrode 3a of the substrate 3 according to the recognition result in the first recognition step. Then, as shown in FIG. 5(d), the solder bump 16 is landed on the electrode 3a for mounting (first mounting step). In this first mounting step, as shown in FIGS. 5(c) and (d), mounting of the third electronic part 13 is also conducted by positioning the leads 13a in registration with the electrodes 3b.

Thereafter, an electronic part for the second level is mounted. Firstly, the position of the first electronic part 11 is recognized by a substrate recognition camera 9. In the present case, among the electrodes 17 formed on the upper plane 11b of the first electronic part 11, those positioned at the diagonal sites in the outermost periphery 17 are perceived as the characteristic portion of the electronic part for position recognition (second recognition step).

Now, the transfer head 8A having picked up the second electronic part 12 from the second part-supplying unit 4B moves to the flux transfer table 15 where, as shown in FIG. 6(a), the flux 20 is coated by transfer on the bottom plane side of the solder bump 18 by elevating and lowering the second electronic part 12 relative to the coated film of the flux 20. Subsequently, the second electronic part 12 is positioned in registration with the first electronic part 11 according to the recognition result in the second recognition step, and the solder bump 18 of the second electronic part 12 is landed on the electrode 17 formed on the upper plane of the first electronic part 11 for mounting (second mounting step).

Thereafter, the substrate 3 is transported to the reflow unit M3, where, by heating substrate 3 on which the first, second and third electronic parts 11, 12 and 13 are mounted to a reflow temperature higher than the solder melting point, the solder bump 16 of the first electronic part 11 is solder-bonded to the electrode 3a of the substrate 3, the lead 13a of the third electronic part 13 is solder-bonded to the electrode 3b, and the solder bump 18 of the second electronic part 12 is solder-bonded to the electrode 17 of the first electronic part 11 (reflow step).

Through these steps, a mounting board completes in which package parts such as the first and second electronic parts 11 and 12 each comprising a resin-sealed semiconductor element are mounted in a stacked structure with a high packaging density. In the foregoing method of manufacturing a mounting board, each of the first and second electronic parts 11 and 12 constituting the stacked structure has passed the function inspection in the manufacturing process as a single package part. Accordingly, the mounted structure resulting from solder-bonding of these electronic parts via the bonding of the electrode 17 with the solder bump 18 also has a high reliability. Moreover, such mounting structure can be achieved by using an existing electronic part-mounting apparatus.

Thus, compared with the conventional method comprising forming a semiconductor package by sealing, with a resin, the semiconductor elements to be installed in the first and second electronic parts 11 and 12 after stacking of these parts by themselves whereby a considerable development period is required, a stacked structure can be realized at a low cost and in a short period. Therefore, the kind of the electronic part which is to be used in a semiconductor package of stacked structure can be expanded considerably.

Meanwhile, in the foregoing embodiments, the flux 20 fed by the flux transfer table 15 is of the type used for general-purpose solder bonding, namely, a pasty material having an activity of eliminating the oxidized film formed on the surface of the solder bump 18 or the electrode 17 as an example. But the flux used in the invention is not limited to such type, but, as will be explained below as the flux 20, those types of flux containing a metallic ingredient (for example, a noble metal such as silver, a solder having a higher melting point than the solder used for the solder bump 18) which exhibits good solder wetting property can also be used.

Specifically, a silver-containing type of flux having silver in the form of foil or particle blended in a pasty material having the aforementioned activity, a solder paste in which solder particles are mixed in flux, etc. can be used as the flux 20. By using such types of flux, the following advantage can be obtained for the achievement of good solder bonding between the solder bump 18 and the electrode 17 in the reflow step.

In the case where, as the second electronic part 12, a BGA type one, which is mounted with a semiconductor element on a thin resinous substrate and liable to bend, is used, such a situation is likely to occur that the solder bump 18 would not be evenly landed on the electrode 17 due to bending deformation when the first electronic part 11 has been mounted, thus causing part of the solder bump 18 to be apart from the electrode 17. When the substrate in such a state is transported to the reflow unit, the liquidized solder resulting from the melting of the solder bump 18 sometimes fails in reaching the surface of the electrode 18, thus resulting in a poor bonding.

On the contrary, by using a silver-containing type of flux or a solder paste as the flux 20, even when a spacing exists between the solder bump 18 and the electrode 17, the liquidized solder resulting from the melted solder bump 18 is guided gradually by the metallic ingredient such as silver foil or solder particle that exhibits good solder wetting property to and is present in the flux 20 filling the spacing between the solder bump 18 and the electrode 17, and reaches the surface of the electrode 17 with ease. With such a mechanism, even when a spacing exists between the solder bump 18 and the electrode 17, a sound solder bonding results free of unconnected portions.

The method of manufacturing mounting boards of the invention has an advantage of a wide applicability of the stacked structure at a low cost, and is useful for the industrial segment of mounting board manufacture where electronic parts on a substrate are mounted in a stacked multiple level structure.

What is claimed is:

1. A method of manufacturing a mounting board comprising electronic parts, each of the electronic parts which have a solder bump provided on the bottom surface thereof and is laminated on a substrate in multiple levels, the method comprises:

a solder-feeding step of feeding a solder onto a first electrode of the substrate;

a first recognition step of recognizing the position of the substrate;

a first mounting step of positioning a first electronic part for a first level relative to the substrate according to the recognition result in the first recognition step and mounting by landing the solder bump of the first electric part onto the first electrode;

a second recognition step of recognizing the position of the first electronic part;

a second mounting step of positioning a second electronic part for a second level relative to the first electronic part according to the recognition result in the second recognition step and mounting by landing the solder bump of the second electronic part on a second electrode provided on the upper face of the first electronic part; and a reflow step of heating the substrate on which the first electronic part and the second electronic part are mounted so as to solder-bond the first electronic part to the substrate and at the same time solder-bond the second electronic part to the first electronic part, and further comprising: a step of feeding flux used for solder bonding on a flux transfer table; and a step of transferring the flux onto the solder bump of the second electronic part on the flux transfer table prior to the second mounting step.

2. The method of manufacturing a mounting board set forth in claim 1, wherein the flux is a pasty material having an active function of eliminating the oxidized film formed on the surface of the solder bump and the first and second electrode.

3. The method of manufacturing a mounting board set forth in claim 1 wherein the flux is a silver-incorporated one comprising silver in the form of foil or particle blended in a pasty material.

4. The method of manufacturing a mounting board set forth in claim 1 wherein the flux is a solder paste comprising solder particles dispersed in flux.

* * * * *